(12) United States Patent
Sikma et al.

(10) Patent No.: US 9,944,828 B2
(45) Date of Patent: Apr. 17, 2018

(54) SLURRY FOR CHEMICAL MECHANICAL POLISHING OF COBALT

(71) Applicant: Cabot Microelectronics Corporation, Aurora, IL (US)

(72) Inventors: Elise Sikma, Bartlett, IL (US); Witold Paw, Aurora, IL (US); Benjamin Petro, Aurora, IL (US); Jeffrey Cross, Batavia, IL (US); Glenn Whitener, Batavia, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 108 days.

(21) Appl. No.: 14/919,526

(22) Filed: Oct. 21, 2015

(65) Prior Publication Data
US 2016/0108286 A1 Apr. 21, 2016

Related U.S. Application Data

(60) Provisional application No. 62/066,484, filed on Oct. 21, 2014.

(51) Int. Cl.
*H01L 21/302* (2006.01)
*H01L 21/461* (2006.01)
(Continued)

(52) U.S. Cl.
CPC ............ *C09G 1/02* (2013.01); *B24B 37/044* (2013.01); *C23F 3/04* (2013.01); *C23F 3/06* (2013.01); *H01L 21/3212* (2013.01)

(58) Field of Classification Search
USPC ....................................................... 438/693
See application file for complete search history.

(56) References Cited

U.S. PATENT DOCUMENTS 4,711,735 A 12/1987 Gulley
5,196,353 A 3/1993 Sandhu et al.
(Continued)

FOREIGN PATENT DOCUMENTS

CN 101525563 A 9/2009
CN 101580700 A 11/2009
(Continued)

OTHER PUBLICATIONS

Korean Intellectual Property Office, International Search Report in International Patent Application No. PCT/US2015/056744 (dated Dec. 23, 2015).
(Continued)

*Primary Examiner* — Roberts Culbert
(74) *Attorney, Agent, or Firm* — Thomas Omholt; Erika S. Wilson; Ashlee B. Szelag

(57) ABSTRACT

The invention provides a chemical-mechanical polishing composition including (a) an abrasive comprising alumina particles, silica particles, or a combination thereof, (b) a rate accelerator comprising a phosphonic acid, an N-heterocyclic compound, or a combination thereof, (c) a corrosion inhibitor comprising an amphoteric surfactant, a sulfonate, a phosphonate, a carboxylate, a fatty acid amino acid, an amine, an amide, or a combination thereof, (d) an oxidizing agent, and (e) an aqueous carrier. The invention also provides a method of polishing a substrate, especially a substrate comprising a cobalt layer, with the polishing composition.

19 Claims, 7 Drawing Sheets

(51) Int. Cl.
  *C09G 1/02* (2006.01)
  *B24B 37/04* (2012.01)
  *C23F 3/04* (2006.01)
  *C23F 3/06* (2006.01)
  *H01L 21/321* (2006.01)

(56) References Cited

U.S. PATENT DOCUMENTS

| | | |
|---|---|---|
| 5,230,833 A | 7/1993 | Romberger et al. |
| 5,316,573 A | 5/1994 | Brusic et al. |
| 5,433,651 A | 7/1995 | Lustig et al. |
| 5,567,534 A | 10/1996 | Yano et al. |
| 5,609,511 A | 3/1997 | Moriyama et al. |
| 5,643,046 A | 7/1997 | Katakabe et al. |
| 5,658,183 A | 8/1997 | Sandhu et al. |
| 5,730,642 A | 3/1998 | Sandhu et al. |
| 5,838,447 A | 11/1998 | Hiyama et al. |
| 5,872,633 A | 2/1999 | Holzapfel et al. |
| 5,893,796 A | 4/1999 | Birang et al. |
| 5,949,927 A | 9/1999 | Tang |
| 5,964,643 A | 10/1999 | Birang et al. |
| 6,083,838 A * | 7/2000 | Burton ............... H01L 21/3212 257/E21.304 |
| 6,585,933 B1 | 7/2003 | Ehrhardt et al. |
| 6,984,340 B1 | 1/2006 | Brady et al. |
| 7,931,714 B2 | 4/2011 | Chang |
| 8,337,716 B2 | 12/2012 | Chang |
| 8,338,300 B2 | 12/2012 | Lee et al. |
| 8,641,920 B2 | 2/2014 | Chang et al. |
| 8,717,710 B2 | 5/2014 | Dai et al. |
| 8,722,592 B2 | 5/2014 | Matulewicz et al. |
| 9,039,925 B2 | 5/2015 | Chen et al. |
| 9,045,717 B2 | 6/2015 | Nakanishi et al. |
| 2004/0148867 A1 | 8/2004 | Matsumi |
| 2007/0090094 A1* | 4/2007 | Thompson ............... C09G 1/02 216/89 |
| 2007/0181850 A1* | 8/2007 | Kamimura ............... C09G 1/02 252/79.1 |
| 2009/0184287 A1* | 7/2009 | Chang ..................... C09G 1/02 252/79.1 |
| 2010/0029079 A1 | 2/2010 | Ghosh et al. |
| 2010/0151683 A1 | 6/2010 | Liu |
| 2010/0163784 A1 | 7/2010 | Chang et al. |
| 2011/0100956 A1 | 5/2011 | Keleher et al. |
| 2013/0045598 A1 | 2/2013 | Guo et al. |
| 2013/0140273 A1* | 6/2013 | Lu ........................... C09G 1/02 216/53 |
| 2013/0186850 A1 | 7/2013 | Wang et al. |
| 2013/0261040 A1 | 10/2013 | Kawada et al. |
| 2014/0004703 A1 | 1/2014 | Noller et al. |
| 2014/0199840 A1 | 7/2014 | Bajaj et al. |
| 2014/0243250 A1 | 8/2014 | Miller et al. |
| 2015/0152289 A1 | 6/2015 | Zhang et al. |

FOREIGN PATENT DOCUMENTS

| | | |
|---|---|---|
| JP | 2011-159658 A | 8/2011 |
| KR | 10-2009-0087268 A | 8/2009 |
| KR | 10-2013-0129997 A | 11/2013 |
| WO | WO 2012/127399 A1 | 9/2012 |

OTHER PUBLICATIONS

Jiang et al., "Synergetic effect of $H_2O_2$ and glycine on cobalt CMP in weakly alkaline slurry," *Microelectronic Engineering*, 122: 82-86 (2014).

Peethala et al., "Cobalt Polishing with Reduced Galvanic Corrosion at Copper/Cobalt Interface Using Hydrogen Peroxide as an Oxidizer in Colloidal Silica-Based Slurries," *Journal of The Electrochemical Society*, 159(6): H582-H588 (2012).

Žerjav et al., "Carboxylic Acids as Corrosion Inhibitors for Cu, Zn and Brasses in Simulated Urban Rain," *International Journal of Electrochemical Science*, 9: 2696-2715 (2014).

Korean Intellectual Property Office, International Search Report in International Patent Application No. PCT/US2015/056749 (dated Jan. 28, 2016).

Korean Intellectual Property Office, International Search Report in International Patent Application No. PCT/US2015/056756 (dated Jan. 28, 2016).

* cited by examiner

SLURRY FOR CHEMICAL MECHANICAL POLISHING OF COBALT

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry) for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

The chemical-mechanical polishing of cobalt (Co) is becoming increasingly important in advanced circuit integration techniques. Although compositions designed for polishing copper (Cu) are known in the art, these polishing compositions do not always provide satisfactory polishing performance for cobalt. In particular, rate accelerators used in copper polishing compositions may not provide satisfactory cobalt removal rates. In addition, copper corrosion inhibitors may not adequately protect the cobalt surface from undesirable chemical attack and etching.

A need remains for polishing compositions and methods that provide effective cobalt removal rates, while suppressing the static etch rate and corrosion of cobalt. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising (a) an abrasive comprising alumina particles, silica particles, or a combination thereof, (b) a rate accelerator comprising a phosphonic acid, an N-heterocyclic compound, or a combination thereof, (c) a corrosion inhibitor comprising an amphoteric surfactant, a sulfonate, a phosphonate, a carboxylate, a fatty acid amino acid, an amine, an amide, or a combination thereof, (d) an oxidizing agent, and (e) an aqueous carrier.

The invention also provides a method of polishing a substrate comprising (i) providing a substrate, such as a cobalt layer; (ii) providing a polishing pad; (iii) providing a chemical-mechanical polishing composition comprising (a) an abrasive comprising alumina particles, silica particles, or a combination thereof, (b) a rate accelerator comprising a phosphonic acid, an N-heterocyclic compound, or a combination thereof, (c) a corrosion inhibitor comprising an amphoteric surfactant, a sulfonate, a phosphonate, a carboxylate, a fatty acid amino acid, an amine, an amide, or a combination thereof, (d) an oxidizing agent, and (e) an aqueous carrier; (iv) contacting the substrate with the polishing pad and the chemical-mechanical polishing composition; and (v) moving the polishing pad and the chemical-mechanical polishing composition relative to the substrate, such as the cobalt layer on a surface of the substrate, to abrade at least a portion of the substrate to polish the substrate.

BRIEF DESCRIPTION OF THE SEVERAL VIEWS OF THE DRAWING(S)

DETAILED DESCRIPTION OF THE INVENTION

Figure 1:
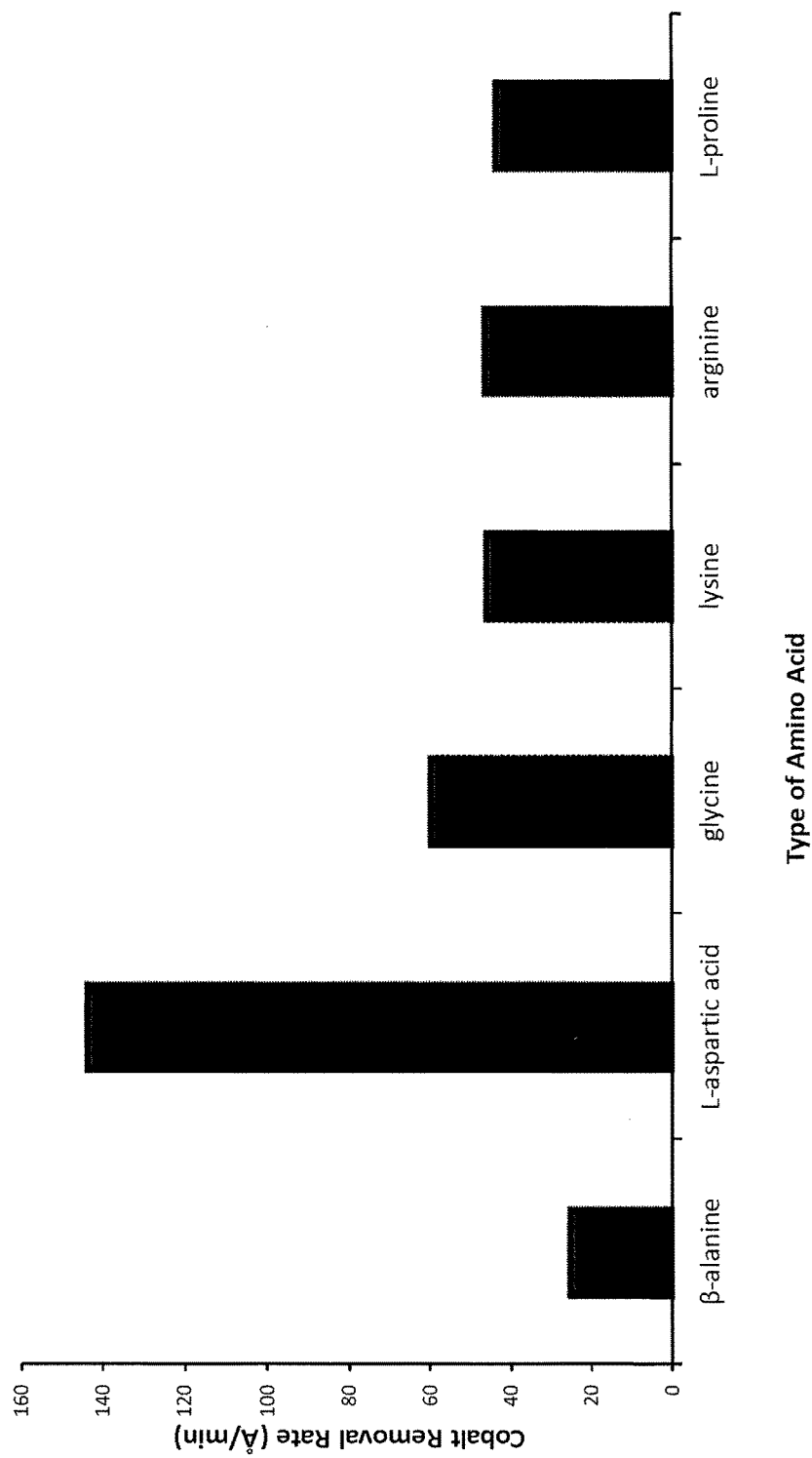
FIG. 1 illustrates the cobalt removal rate (Å/min) for polishing compositions comprising different simple amino acids.

The invention provides a chemical-mechanical polishing composition comprising, consisting essentially of, or consisting of (a) an abrasive comprising, consisting essentially of, or consisting of alumina particles, silica particles, or a combination thereof, (b) a rate accelerator comprising, consisting essentially of, or consisting of a phosphonic acid, an N-heterocyclic compound, or a combination thereof, (c) a corrosion inhibitor comprising, consisting essentially of, or consisting of an amphoteric surfactant, a sulfonate, a phosphonate, a carboxylate, a fatty acid amino acid, an amine, an amide, or a combination thereof, (d) an oxidizing agent, and (e) an aqueous carrier.

The polishing composition comprises an abrasive (i.e., one or more abrasives). The abrasive can be any suitable abrasive or combination of abrasives. Desirably, the abrasive comprises, consists essentially of, or consists of alumina particles, silica particles, or a combination thereof. For example, the abrasive can comprise alumina particles, wherein the abrasive does not include silica particles. Alternatively, the abrasive can comprise silica particles, wherein the abrasive does not include alumina particles.

In a preferred embodiment, the abrasive comprises, consists essentially of, or consists of alumina particles. The alumina particles can be any suitable alumina particles. For example, the alumina particles can be alpha alumina particles (i.e., α-alumina), gamma alumina particles (i.e., γ-alumina), delta alumina particles (i.e., δ-alumina), or fumed alumina particles. Alternatively, the alumina particles can be any suitable alumina particles, wherein the alumina particles do not include one or more of alpha alumina particles, gamma alumina particles, delta alumina particles, and fumed alumina particles.

Preferably, the alumina particles are alpha alumina particles. Alpha alumina refers to a crystalline polymorph of aluminum oxide formed at high temperatures above 1400° C., and typically refers to alumina comprising about 50 wt. % or more of the alpha polymorph. Alpha alumina is well known in the art and available commercially in a wide range of particle sizes and surface areas.

More preferably, the abrasive comprises alpha alumina particles, and at least a portion of the surface of the alpha alumina particles is coated with a negatively-charged polymer or copolymer. For example, about 5 wt. % or more (e.g., about 10 wt. % or more, about 50 wt. % or more, substantially all, or all) of the surface of the alpha alumina can be coated with a negatively-charged polymer or copolymer. The negatively-charged polymer or copolymer can be any suitable polymer or copolymer. Preferably, the negatively-charged polymer or copolymer comprises repeating units selected from carboxylic acid, sulfonic acid, or phosphonic acid functional groups. More preferably, the negatively-charged polymer or copolymer comprises repeating units selected from acrylic acid, methacrylic acid, itaconic acid, maleic acid, maleic anhydride, vinyl sulfonic acid, 2-(methacryloyloxy)ethanesulfonic acid, styrene sulfonic acid, 2-acrylamido-2-methylpropane sulfonic acid, vinylphosphonic acid, 2-(methacroyloxy)ethylphosphate, or a combination thereof. Most preferably, the negatively-charged polymer or copolymer is selected from poly(2-acrylamido-2-methylpropane sulfonic acid) or polystyrenesulfonic acid. Since alpha alumina particles typically have a positively-charged surface, the association of the polymer or copolymer with alpha alumina particles results in deprotonation of at least part of the acidic functional groups on the polymer or copolymer, thus rendering the polymer or copolymer negatively-charged in association with the alpha alumina particles.

The alumina particles can have any suitable particle size. The particle size of a particle is the diameter of the smallest sphere that encompasses the particle. The particle size of the alumina particles can be measured using any suitable technique, for example, using laser diffraction techniques. Suitable particle size measurement instruments are commercially available, such as from Malvern Instruments (Malvern, UK) and Horiba Scientific (Kyoto, Japan). The alumina particles can have an average particle size of about 10 nm or more, e.g., about 20 nm or more, about 30 nm or more, about 40 nm or more, or about 50 nm or more. Alternatively, or in addition, the alumina particles can have an average particle size of about 1000 nm or less, e.g., about 750 nm or less, about 500 nm or less, about 250 nm or less, about 200 nm or less, about 150 nm or less, or about 100 nm or less. Thus, the alumina particles can have an average particle size within a range bounded by any two of the aforementioned endpoints. For example, the alumina particles can have an average particle size of about 10 nm to about 1000 nm, e.g., about 25 nm to about 750 nm, about 40 nm to about 500 nm, about 50 nm to about 250 nm, about 50 nm to about 150 nm, or about 50 nm to about 125 nm.

The alumina particles can be present in the polishing composition at any suitable concentration. For example, the alumina particles can be present in the polishing composition at a concentration of about 0.1 wt. % or more, e.g., about 0.15 wt. % or more, about 0.2 wt. % or more, about 0.25 wt. % or more, about 0.3 wt. % or more, about 0.4 wt. % or more, about 0.5 wt. % or more, about 0.75 wt. % or more, or about 1 wt. % or more. Alternatively, or in addition, the alumina particles can be present in the polishing composition at a concentration of about 5 wt. % or less, e.g., about 4 wt. % or less, about 3 wt. % or less, about 2.5 wt. % or less, about 2 wt. % or less, about 1.5 wt. % or less, about 1.25 wt. % or less, or about 1 wt. % or less. Thus, the alumina particles can be present in the polishing composition at a concentration within a range bounded by any two of the aforementioned endpoints. Preferably, the alumina particles are present in the polishing composition at a concentration of about 0.1 wt. % to about 3 wt. %, e.g., about 0.15 wt % to about 2.75 wt. %, about 0.2 wt. % to about 2.5 wt. %, about 0.25 wt. % to about 2.5 wt. %, about 0.3 wt. % to about 2 wt. %, or about 0.4 wt. % to about 2 wt. %. More preferably, the alumina particles are present in the polishing composition at a concentration of about 0.3 wt. % to about 1.5 wt. %, e.g., about 0.3 wt. % to about 1.25 wt. %, or about 0.4 wt. % to about 1.5 wt. %.

In another preferred embodiment, the abrasive comprises, consists essentially of, or consists of silica particles. The silica particles can be any suitable silica particles. For example, the silica particles can be colloidal silica particles. Colloidal silica particles typically are non-aggregated, individually discrete particles, which generally are spherical or nearly spherical in shape, but can have other shapes (e.g., shapes with generally elliptical, square, or rectangular cross-sections). Such particles typically are structurally different from fumed particles, which are prepared via a pyrogenic or flame hydrolysis process and are chain-like structures of aggregated primary particles. Alternatively, the silica particles can be any suitable silica particles, wherein the silica particles do not include colloidal silica particles.

Preferably, the silica particles are colloidal silica particles. Desirably, the colloidal silica particles are precipitated or condensation-polymerized silica, which can be prepared using any method known to those of ordinary skill in the art, such as by the sol gel method or by silicate ion-exchange. Condensation-polymerized silica particles typically are prepared by condensing $Si(OH)_4$ to form substantially spherical particles. The precursor $Si(OH)_4$ can be obtained, for example, by hydrolysis of high purity alkoxysilanes, or by acidification of aqueous silicate solutions. Such abrasive particles can be prepared in accordance with U.S. Pat. No. 5,230,833 or can be obtained as any of various commercially available products such as the Akzo-Nobel BINDZIL™ silica products and the Nalco silica products, as well as other similar products available from DuPont, Bayer, Applied Research, Nissan Chemical, Fuso, and Clariant.

The colloidal silica particles can have any suitable surface charge. Preferably, the colloidal silica particles are anionic colloidal silica particles. By "anionic" is meant that the colloidal silica particles have a negative surface charge at the pH of the polishing composition. Colloidal silica particles can be anionic in their natural state at the pH of the polishing composition, or colloidal silica particles can be rendered anionic at the pH of the polishing composition using any method known to those of ordinary skill in the art, such as, for example, by surface metal doping, e.g., by doping with aluminum ions, or by surface treatment with a tethered organic acid, a tethered sulfur-based acid, or a tethered phosphorus-based acid.

The silica particles can have any suitable particle size. The particle size of a particle is the diameter of the smallest sphere that encompasses the particle. The particle size of the silica particles can be measured using any suitable technique, for example, using laser diffraction techniques. Suitable particle size measurement instruments are commercially available, such as from Malvern Instruments (Malvern, UK) and Horiba Scientific (Kyoto, Japan). The silica particles can have an average particle size of about 1 nm or more, e.g., about 2 nm or more, about 4 nm or more, about 5 nm or more, about 10 nm or more, about 20 nm or more, about 25 nm or more, about 50 nm or more, or about 75 nm or more. Alternatively, or in addition, the silica particles can have an average particle size of about 1000 nm or less, e.g., about 750 nm or less, about 500 nm or less, about 300 nm or less, about 250 nm or less, about 120 nm or less, about 150 nm or less, about 100 nm or less, or about 75 nm or less. Thus, the silica particles can have an average particle size within a range bounded by any two of the aforementioned endpoints. For example, the silica particles can have an average particle size of about 1 nm to about 1000 nm, e.g., about 4 nm to about 750 nm, about 10 nm to about 500 nm, about 20 nm to about 300 nm, or about 50 nm to about 120 nm.

The silica particles can be present in the polishing composition at any suitable concentration. For example, the silica particles can be present in the polishing composition at a concentration of about 0.1 wt. % or more, e.g., about 0.2 wt. % or more, about 0.25 wt. % or more, about 0.3 wt. % or more, about 0.4 wt. % or more, about 0.5 wt. % or more, or about 0.75 wt. % or more. Alternatively, or in addition, the silica particles can be present in the polishing composition at a concentration of about 5 wt. % or less, e.g., about 4 wt. % or less, about 3 wt. % or less, about 2 wt. % or less, about 1.5 wt. % or less, about 1.25 wt. % or less, about 1 wt. % or less, about 0.75 wt. % or less, or about 0.5 wt. % or less. Thus, the silica particles can be present in the polishing composition at a concentration within a range bounded by any two of the aforementioned endpoints. Preferably, the silica particles are present in the polishing composition at a concentration of about 0.3 wt. % to about 1.5 wt. %, e.g., about 0.3 wt. % to about 1.25 wt. %, or about 0.4 wt. % to about 1.5 wt. %. More preferably, the silica particles are present in the polishing composition at a concentration of about 0.3 wt. % to about 1 wt. %, e.g., about 0.3 wt. % to about 0.75 wt. %, or about 0.3 wt. % to about 0.5 wt. %.

The polishing composition optionally can comprise additional abrasive particles. The additional abrasive particles can be, for example, metal oxide abrasive particles of ceria (e.g., cerium oxide), zirconia (e.g., zirconium oxide), titania (e.g., titanium dioxide), germania (e.g., germanium dioxide, germanium oxide), magnesia (e.g., magnesium oxide), nickel oxide, co-formed products thereof, or combinations thereof. The additional abrasive particles also can be organic particles of gelatin, latex, cellulose, polystyrene, or polyacrylate.

Alternatively, the abrasive can comprise alumina particles, wherein the abrasive does not include one or more of ceria particles, zirconia particles, titania particles, germania particles, magnesia particles, nickel oxide particles, gelatin particles, latex particles, cellulose particles, polystyrene particles, and polyacrylate particles. In addition, the abrasive can comprise silica particles, wherein the abrasive does not include one or more of ceria particles, zirconia particles, titania particles, germania particles, magnesia particles, nickel oxide particles, gelatin particles, latex particles, cellulose particles, polystyrene particles, and polyacrylate particles.

The abrasive particles (i.e., the alumina particles, silica particles, and any additional abrasive particles, in total), can be present in the polishing composition at any suitable concentration. For example, the abrasive particles can be present in the polishing composition at a concentration of about 0.01 wt. % or more, e.g., about 0.015 wt. % or more, about 0.02 wt. % or more, about 0.025 wt. % or more, about 0.03 wt. % or more, about 0.035 wt. % or more, about 0.04 wt. % or more, about 0.05 wt. % or more, about 0.075 wt. % or more, about 0.1 wt. % or more, about 0.15 wt. % or more, about 0.2 wt. % or more, about 0.25 wt. % or more, about 0.3 wt. % or more, about 0.5 wt. % or more, or about 0.75 wt. % or more. Alternatively, or in addition, the abrasive particles can be present in the polishing composition at a concentration of about 15 wt. % or less, e.g., about 14 wt. % or less, about 13 wt. % or less, about 12 wt. % or less, about 10 wt. % or less, about 8 wt. % or less, about 5 wt. % or less, about 4 wt. % or less, about 3 wt. % or less, about 2 wt. % or less, or about 1 wt. % or less. Thus, the abrasive particles can be present in the polishing composition at a concentration within a range bounded by any two of the aforementioned endpoints.

Preferably, the abrasive particles are present in the polishing composition at a concentration of about 0.1 wt. % to about 13 wt. %, e.g., about 0.15 wt. % to about 12 wt. %, about 0.2 wt. % to about 10 wt. %, about 0.2 wt. % to about 8 wt. %, about 0.3 wt. % to about 5 wt. %, about 0.3 wt. % to about 4 wt. %, or about 0.5 wt. % to about 3 wt. %.

The alumina particles, silica particles, or a combination thereof, and any additional abrasive particles present in the polishing composition, desirably are suspended in the polishing composition, more specifically in the aqueous carrier of the polishing composition. When the abrasive particles are suspended in the polishing composition, the abrasive particles preferably are colloidally stable. The term colloid refers to the suspension of abrasive particles in the aqueous carrier. Colloidal stability refers to the maintenance of that suspension over time. In the context of this invention, abrasive particles are considered colloidally stable if, when the abrasive particles are placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The polishing composition further comprises a rate accelerator (i.e., one or more rate accelerators). The rate accelerator comprises, consists essentially of, or consists of a phosphonic acid, an N-heterocyclic compound, or a combination thereof.

In a preferred embodiment, the rate accelerator comprises, consists essentially of, or consists of a phosphonic acid. The phosphonic acid can be any suitable phosphonic acid. Preferably, the phosphonic acid is an amino tri(methylene phosphonic acid) or a 1-hydroxyethylidene-1,1,-diphosphonic acid. Suitable phosphonic acids are commercially available, for example, from Italmatch Chemicals (e.g., DEQUEST™ 2000 and DEQUEST™ 2010). Alternatively, the phosphonic acid can be any suitable phosphonic acid, wherein the phosphonic acid does not include one or more of an amino tri(methylene phosphonic acid) and a 1-hydroxyethylidene-1,1,-diphosphonic acid.

In another preferred embodiment, the rate accelerator comprises, consists essentially of, or consists of an N-heterocyclic compound. The N-heterocyclic compound can be any suitable N-heterocyclic compound. Preferably, the N-heterocyclic compound is picolinic acid, L-histidine, 2-mercapto-1-methylimidazole, or imidazole. Alternatively, the N-heterocyclic compound can be any suitable N-heterocyclic compound, wherein the N-heterocyclic compound does not include one or more of picolinic acid, 2-mercapto-1-methylimidazole, and imidazole.

The rate accelerator (i.e., the phosphonic acid, N-heterocyclic compound, or combination thereof, in total) can be present in the polishing composition at any suitable concentration. For example, the rate accelerator can be present in the polishing composition at a concentration of about 0.05 wt. % or more, e.g., about 0.075 wt. % or more, about 0.1 wt. % or more, about 0.15 wt. % or more, about 0.2 wt. % or more, about 0.25 wt. % or more, about 0.5 wt. % or more, or about 0.75 wt. % or more. Alternatively, or in addition, the rate accelerator can be present in the polishing composition at a concentration of about 8 wt. % or less, e.g., about 7 wt. % or less, about 6 wt. % or less, about 5 wt. % or less, about 4 wt. % or less, about 3 wt. % or less, about 2 wt. % or less, or about 1 wt. % or less. Thus, the rate accelerator can be present in the polishing composition at a concentration within a range bounded by any two of the aforementioned endpoints.

Preferably, the rate accelerator is present in the polishing composition at a concentration of about 0.05 wt. % to about 5 wt. %, e.g., about 0.05 wt. % to about 3 wt. %, or about 0.1 wt. % to about 2 wt. %. More preferably, the rate accelerator is present in the polishing composition at a concentration of about 0.2 wt. % to about 1 wt. %.

The polishing composition optionally further comprises a secondary rate accelerator (i.e., one or more secondary rate accelerators). Desirably, the secondary rate accelerator comprises, consists essentially of, or consists of a phosphate salt, a borate salt, or a combination thereof. For example, the secondary rate accelerator can be ammonium phosphate, ammonium borate, potassium phosphate, potassium borate, or a combination thereof.

The secondary rate accelerator (i.e., the phosphate salt, borate salt, or combination thereof, in total) can be present in the polishing composition at any suitable concentration. For example, the secondary rate accelerator can be present in the polishing composition at a concentration of about 0.005 wt. % or more, e.g., about 0.0075 wt. % or more, about 0.01 wt. % or more, about 0.025 wt. % or more, about 0.05 wt. % or more, about 0.075 wt. % or more, about 0.1 wt. % or more, about 0.25 wt. % or more, or about 0.5 wt. % or more. Alternatively, or in addition, the secondary rate accelerator can be present in the polishing composition at a concentration of about 5 wt. % or less, e.g., about 4 wt. % or less, about 3 wt. % or less, about 2 wt. % or less, about 1 wt. % or less, or about 0.75 wt. % or less. Thus, the secondary rate accelerator can be present in the polishing composition at a concentration within a range bounded by any two of the aforementioned endpoints. Preferably, the secondary rate accelerator is present in the polishing composition at a concentration of about 0.1 wt. % to about 5 wt. %, e.g., about 0.1 wt. % to about 4 wt. %, about 0.1 wt. % to about 3 wt. %, or about 0.5 wt. % to about 2 wt. %. More preferably, the secondary rate accelerator is present in the polishing composition at a concentration of about 0.1 wt. % to about 1 wt. %, e.g., about 0.25 wt. % to about 1 wt. %, about 0.1 wt. % to about 0.75 wt. %.

The polishing composition further comprises a corrosion inhibitor (i.e., one or more corrosion inhibitors). The corrosion inhibitor comprises, consists essentially of, or consists of an amphoteric surfactant, a sulfonate, a phosphonate, a carboxylate, a fatty acid amino acid, an amine, an amide, or a combination thereof.

In one embodiment, the corrosion inhibitor comprises, consists essentially of, or consists of an amphoteric surfactant. The amphoteric surfactant can be any suitable amphoteric surfactant. For example, the amphoteric surfactant can be a sodium laurimino dipropionate or a betaine, such as a $C_{12}$-$C_{14}$-alkyldimethyl-betaine. Suitable amphoteric surfactants are commercially available, for example, from Rhodia (e.g., MIRATAINE™ H2C-HA) and Sigma-Aldrich (e.g., EMPIGEN™ BB). Alternatively, the amphoteric surfactant can be any suitable amphoteric surfactant, wherein the amphoteric surfactant does not include one or more of a sodium laurimino dipropionate and a betaine.

In another embodiment, the corrosion inhibitor comprises, consists essentially of, or consists of a sulfonate. The sulfonate can be any suitable sulfonate. For example, the sulfonate can be a sodium $C_{14-17}$ sec-alkyl sulfonate or a $C_{12}$ alkylbenzenesulfonate amine salt. Suitable sulfonates are commercially available, for example, from Clariant (e.g., HOSTAPUR™ SAS 30 and HOSTAPUR™ SAS 60) and AkzoNobel (e.g., WITCONATE™ P-1059). Alternatively, the sulfonate can be any suitable sulfonate, wherein the sulfonate does not include one or more of a sodium $C_{14-17}$ sec-alkyl sulfonate and a $C_{12}$ alkylbenzenesulfonate amine salt.

In an alternative embodiment, the corrosion inhibitor comprises, consists essentially of, or consists of a phosphonate. The phosphonate can be any suitable phosphonate. For example, the phosphonate can be an alkyl phosphonate derivative or an octyl phosphonic acid. Suitable phosphonates are commercially available, for example, from Solvay (e.g., RHODAFAC™ ASI-80 and RHODAFAC™ ASI-100). Alternatively, the phosphonate can be any suitable phosphonate, wherein the phosphonate does not include one or more of an alkyl phosphonate derivative and an octyl phosphonic acid.

In an additional embodiment, the corrosion inhibitor comprises, consists essentially of, or consists of a carboxylate. The carboxylate can be any suitable carboxylate. For example, the carboxylate can be sodium ricinoleate. Alternatively, the carboxylate can be any suitable carboxylate, wherein the carboxylate does not include sodium ricinoleate.

In an alternative embodiment, the corrosion inhibitor comprises, consists essentially of, or consists of a fatty acid amino acid. The fatty acid amino acid can be any suitable fatty acid amino acid. For example, the fatty acid amino acid can be sodium lauroyl sarcosinate, sodium cocoyl alaninate, cocoyl glutamate, cocoyl sarcosinate, or myristoyl sarcosinate. Suitable fatty acid amino acids are commercially available, for example, from Ajinomoto Co., Inc. (e.g., AMILITE™ ACS-12, AMISOFT™ CK-22, and AMISOFT™ CT-12), and from Struktol Co. (e.g., PERLASTAN™ C30, PERLASTAN™ C, PERLASTAN™ SL, and PERLASTAN™ M30). Alternatively, the fatty acid amino acid can be any suitable fatty acid amino acid, wherein the fatty acid amino acid does not include one or more of sodium lauroyl sarcosinate, sodium cocoyl alaninate, cocoyl glutamate, cocoyl sarcosinate, and myristoyl sarcosinate.

In an additional embodiment, the corrosion inhibitor comprises, consists essentially of, or consists of an amine. The amine can be any suitable amine. For example, the amine can be octyl amine. Alternatively, the amine can be any suitable amine, wherein the amine does not include octyl amine.

In another embodiment, the corrosion inhibitor comprises, consists essentially of, or consists of an amide. The amide can be any suitable amide. For example, the amide can be a cocoyl diethanolamide, a biuret, or a picolinamide. Suitable amides are commercially available, for example, from Element is Specialties (e.g., SERDOLAMIDE™ PPF 67). Alternatively, the amide can be any suitable amide, wherein the amide does not include one or more of a cocoyl diethanolamide, a biuret, and a picolinamide.

In a preferred embodiment, the corrosion inhibitor comprises, consists essentially of, or consists of a sulfonate, a fatty acid amino acid, an amide, or a combination thereof. In another preferred embodiment, the corrosion inhibitor comprises, consists essentially of, or consists of an amphoteric surfactant, a fatty acid amino acid, an amide, or a combination thereof.

The effectiveness of corrosion inhibition can be determined from a static etch rate (SER) test. In a typical test, a small piece of cobalt wafer is exposed to a chemical-mechanical polishing composition at a given temperature, e.g., 35° C., for a given amount of time, e.g., 5 minutes, without polishing. The thickness of the cobalt wafer is measured before and after the SER test, and the resulting SER is expressed in Å/min.

The corrosion inhibitor (i.e., the amphoteric surfactant, sulfonate, phosphonate, carboxylate, fatty acid amino acid, amine, amide, or combination thereof, in total) can be present in the polishing composition at any suitable concentration. For example, the corrosion inhibitor can be present in the polishing composition at a concentration of about 0.001 wt. % or more, e.g., about 0.0025 wt. % or more, about 0.005 wt. % or more, about 0.01 wt. % or more, about 0.05 wt % or more, about 0.075 wt. % or more, about 0.1 wt. % or more, or about 0.25 wt. % or more. Alternatively, or in addition, the corrosion inhibitor can be present in the polishing composition at a concentration of about 1 wt. % or less, e.g., about 0.75 wt. % or less, about 0.5 wt. % or less, about 0.25 wt. % or less, or about 0.1 wt. % or less. Thus, the corrosion inhibitor can be present in the polishing composition at a concentration within a range bounded by any two of the aforementioned endpoints. Preferably, the corrosion inhibitor is present in the polishing composition at a concentration of about 0.001 wt. % to about 0.25 wt. %, e.g., about 0.0025 wt. % to about 0.2 wt. %, about 0.005 wt. % to about 0.15 wt. %, about 0.0075 wt. % to about 0.1 wt. %, about 0.01 wt. % to about 0.1 wt. %, or about 0.05 wt. % to about 0.1 wt. %.

The polishing composition further comprises an oxidizing agent (i.e., one or more oxidizing agents). The function of the oxidizing agent is to oxidize at least a part of a substrate, such as a cobalt layer or cobalt layers. The oxidizing agent can be any suitable oxidizing agent, or combination of oxidizing agents. Non-limiting examples of suitable oxidizing agents include hydrogen peroxide, persulfate salts (e.g., ammonium persulfate), ferric salts (e.g., ferric nitrate), inorganic peroxides, and combinations thereof. Inorganic peroxides include sodium percarbonate, calcium peroxide, and magnesium peroxide. The oxidizing agent can comprise, consist essentially of, or consist of one or more of the aforementioned examples of suitable oxidizing agents. Preferably, the oxidizing agent is hydrogen peroxide. Alternatively, the oxidizing agent can be any suitable oxidizing agent, wherein the oxidizing agent does not include one or more of hydrogen peroxide, persulfate salts, ferric salts, and inorganic peroxides.

The oxidizing agent (i.e., one or more oxidizing agents, in total) can be present in the polishing composition at any suitable concentration. For example, the oxidizing agent can be present in the polishing composition at a concentration of about 0.1 wt. % to about 5 wt. %, e.g., about 0.2 wt. % to about 5 wt. %, about 0.3 wt. % to about 5 wt. %, or about 0.3 wt. % to about 3 wt. %. Preferably, the oxidizing agent is present in the polishing composition at a concentration of about 0.2 wt. % to about 2 wt. %, e.g., about 0.3 wt. % to about 1.8 wt. %, or about 0.6 wt. % to about 1.2 wt. %.

The polishing composition optionally further comprises an ethylene oxide/propylene oxide block copolymer. Without wishing to be bound by theory, it is believed that the ethylene oxide/propylene oxide block copolymer functions as a suppressant of dielectric removal. In particular, it is believed that the ethylene oxide/propylene oxide block copolymer functions as a suppressant of black diamond (BD) removal.

The ethylene oxide/propylene oxide block copolymer can be any suitable ethylene oxide/propylene oxide block copolymer. For example, the ethylene oxide/propylene oxide block copolymer can be a difunctional block copolymer surfactant terminating in primary hydroxyl groups. Suitable ethylene oxide/propylene oxide block copolymers are commercially available, for example, from BASF Corporation (e.g., the PLURONIC™ series of products, including PLURONIC™ F108). Alternatively, the ethylene oxide/propylene oxide block copolymer can be any suitable ethylene oxide/propylene oxide block copolymer, wherein the ethylene oxide/propylene oxide block copolymer does not include a difunctional block copolymer surfactant terminating in primary hydroxyl groups.

The ethylene oxide/propylene oxide block copolymer can be present in the polishing composition at any suitable concentration. For example, the ethylene oxide/propylene oxide block copolymer can be present in the polishing composition at a concentration of about 0.001 wt. % or more, e.g., about 0.005 wt. % or more, about 0.0075 wt. % or more, about 0.01 wt. % or more, about 0.05 wt. % or more, or about 0.1 wt. % or more. Alternatively, or in addition, the ethylene oxide/propylene oxide block copolymer can be present in the polishing composition at a concentration of about 1 wt. % or less, e.g., about 0.75 wt. % or less, about 0.5 wt. % or less, about 0.25 wt. % or less, or about 0.1 wt. % or less. Thus, the ethylene oxide/propylene oxide block copolymer can be present in the polishing composition at a concentration within a range bounded by any two of the aforementioned endpoints. Preferably, the ethylene oxide/propylene oxide block copolymer is present in the polishing composition at a concentration of about 0.005 wt. % to about 0.1 wt. %, e.g., about 0.0075 wt. % to about 0.1 wt. %, about 0.01 wt. % to about 0.1 wt. %, or about 0.05 wt. % to about 0.1 wt. %.

The polishing composition optionally further comprises a polymeric stabilizer. The polymeric stabilizer can be any suitable stabilizer. Preferably, the polymeric stabilizer is polyacrylic acid. Alternatively, the polymeric stabilizer can be any suitable stabilizer, wherein the polymeric stabilizer does not include polyacrylic acid. The polymeric stabilizer can be present in the polishing composition at any suitable concentration. For example, the polymeric stabilizer can be present in the polishing composition at a concentration of about 0.01 wt. % to about 1 wt. %, e.g., about 0.025 wt. % to about 0.5 wt. %, or about 0.025 wt. % to about 0.1 wt. %. Preferably, the polymeric stabilizer is present in the polishing composition at a concentration of about 0.025 wt. % to about 0.075 wt. %, e.g., about 0.05 wt. %.

The polishing composition can have any suitable pH. Typically, the pH of the polishing composition is about 1 or greater. Alternatively, or in addition, the pH of the polishing composition is about 12 or less. For example, the pH of the polishing composition can be about 7 to about 12, e.g., about 7 to about 11, about 7 to about 9, about 8 to about 11, about 8 to about 10, or about 8 to about 9. The pH of the polishing composition also can be about 3 to about 9, e.g., about 4 to about 8, about 4 to about 7, or about 5 to about 7. Thus, the polishing composition can have a pH in a range defined by any two of these pH values. Preferably, the pH of the polishing composition is about 8 to about 11, or about 4 to about 7.

The pH of the polishing composition can be achieved and/or maintained by any suitable means. More specifically, the polishing composition can further comprise a pH adjustor, a pH buffering agent, or a combination thereof. The CMP composition can further comprise a pH adjustor, a pH buffering agent, or combination thereof. The pH adjustor can be any suitable pH-adjusting compound. For example, the pH adjustor can be any suitable acid or base strong enough to produce the desired final pH. Examples of suitable acids include nitric acid, acetic acid, phosphoric acid, mixtures thereof, and the like. Examples of suitable bases include potassium hydroxide, ammonium hydroxide, tetraalkylammonium hydroxide, mixtures thereof, and the like. The pH buffering agent can be any suitable buffering agent, for example, phosphates, acetates, borates, ammonium salts, mixtures thereof, and the like. The polishing composition can comprise any suitable amount of a pH adjustor and/or a pH buffering agent, provided that a suitable amount is used to achieve and/or maintain the pH of the polishing composition within a suitable range.

Desirably, the polishing composition comprises ammonium hydroxide. Without wishing to be bound by theory, it is believed that ammonium hydroxide, in addition to acting as a pH adjustor and pH buffering agent, can help protect the surface of the cobalt against corrosion.

The polishing composition includes an aqueous carrier. The aqueous carrier contains water (e.g., deionized water) and optionally contains one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The polishing composition optionally further comprises one or more other additives. Such additives include surfactants and/or rheological control agents, antifoaming agents, and biocides. Additives can be present in the polishing composition at any suitable concentration. The biocide can be any suitable biocide, for example, an isothiazolinone biocide.

In a preferred embodiment, the invention provides a chemical-mechanical polishing composition comprising (a) an abrasive comprising, consisting essentially of, or consisting of alumina particles, wherein the alumina particles are alpha alumina particles, and wherein at least a portion of the surface of the alpha alumina particles is coated with a negatively-charged polymer or copolymer; (b) a rate accelerator comprising, consisting essentially of, or consisting of a phosphonic acid; (c) a corrosion inhibitor comprising, consisting essentially of, or consisting of a sulfonate, a fatty acid amino acid, an amide, or a combination thereof; (d) an oxidizing agent; and (e) an aqueous carrier, wherein the pH of the polishing composition is about 7 to about 12.

In another preferred embodiment, the invention provides a chemical-mechanical polishing composition comprising (a) an abrasive comprising, consisting essentially of, or consisting of anionic colloidal silica particles; (b) a rate accelerator comprising, consisting essentially of, or consisting of a phosphonic acid, an N-heterocyclic compound, or a combination thereof; (c) a corrosion inhibitor comprising, consisting essentially of, or consisting of an amphoteric surfactant, a sulfonate, a fatty acid amino acid, an amide, or a combination thereof; (d) an oxidizing agent; and (e) an aqueous carrier, wherein the polishing composition further comprises a secondary rate accelerator comprising a phosphate salt, a borate salt, or a combination thereof, and wherein the pH of the polishing composition is about 3 to about 9.

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., abrasive, rate accelerator, corrosion inhibitor, oxidizing agent, etc.) as well as any combination of ingredients (e.g., abrasive, rate accelerator, corrosion inhibitor, oxidizing agent, etc.).

For example, the rate accelerator, corrosion inhibitor, and/or oxidizing agent can be added to water at the desired concentration(s). The pH can then be adjusted (as desired) and the abrasive can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise a abrasive, a rate accelerator, a corrosion inhibitor, an oxidizing agent, and water, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of polishing a substrate with the polishing composition described herein. The method of polishing a substrate comprises (i) providing a substrate; (ii) providing a polishing pad; (iii) providing the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

In particular, the invention further provides a method of polishing a substrate comprising (i) providing a substrate; (ii) providing a polishing pad; (iii) providing a chemical-mechanical polishing composition comprising, consisting essentially of, or consisting of (a) an abrasive comprising, consisting essentially of, or consisting of alumina particles, silica particles, or a combination thereof, (b) a rate accelerator comprising, consisting essentially of, or consisting of a phosphonic acid, an N-heterocyclic compound, or a combination thereof, (c) a corrosion inhibitor comprising, consisting essentially of, or consisting of an amphoteric surfactant, a sulfonate, a phosphonate, a carboxylate, a fatty acid amino acid, an amine, an amide, or a combination thereof, (d) an oxidizing agent, and (e) an aqueous carrier; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

The polishing composition of the invention is useful for polishing any suitable substrate. The polishing composition is particularly useful in the polishing of a substrate layer comprising, consisting essentially of, or consisting of cobalt. Suitable substrates include, but are not limited to, flat panel displays, integrated circuits, memory or rigid disks, metals, semiconductors, inter-layer dielectric (ILD) devices, microelectromechanical systems (MEMS), ferroelectrics, and magnetic heads. The substrate can further comprise at least one other layer, e.g., an insulating layer. The insulating layer can be a metal oxide, porous metal oxide, glass, organic polymer, fluorinated organic polymer, or any other suitable high or low-K insulating layer, e.g., black diamond (BD). The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, copper, tantalum, tungsten, titanium, platinum, ruthenium, iridium, aluminum, nickel, or combinations thereof.

In accordance with the invention, a substrate can be planarized or polished with the polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the cobalt, or one or more of the substrate materials described herein, with the polishing composition and typically the polishing pad to polish the substrate. Any suitable polishing conditions can be used to polish a substrate according to the invention.

A substrate can be planarized or polished with the chemical-mechanical polishing composition in conjunction with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

EXAMPLES

The following examples further illustrate the invention but, of course, should not be construed as in any way limiting its scope.

Unless indicated otherwise, the polishing experiments reflected in the examples involved the use of a commercially available polishing apparatus. In particular, Examples 1-3 and 7 used a MIRRA™ polishing apparatus, supplied by Applied Materials, with a 10.3 kPa (1.5 psi) downforce pressure of the substrate against a POLITEX™ polishing pad, 103 rpm platen speed, and 200 mL/min polishing composition flow. Examples 4-6 used an AVANTI™ 472 polishing apparatus, supplied by IPEC-Westech, with a 31 kPa (4.5 psi) downforce pressure of the substrate against a POLITEX™ polishing pad, 93 rpm platen speed, and 250 mL/min polishing composition flow. Cobalt PVD (physical vapor deposition) wafers having a thickness of 2000 Å, available from Silyb Wafer Services, were used in all examples.

The static etch rates (SER) of the polishing compositions described in the examples were determined by exposing a small piece of cobalt wafer to the polishing composition at 35° C. for 5 minutes. The SER was determined in Å/min by comparing the thickness of the cobalt wafer before and after the SER test.

Example 1

This example demonstrates that polishing compositions comprising a simple amino acid, without a rate accelerator comprising a phosphonic acid, an N-heterocyclic compound, or a combination thereof, do not provide effective cobalt removal rates at alkaline pH.

Cobalt (Co) substrates were polished with six polishing compositions (i.e., Polishing Compositions 1A-1F). Each of Polishing Compositions 1A-1F contained alpha alumina particles, wherein at least a portion of the surface of the alpha alumina particles was coated with a negatively-charged polymer or copolymer (Polishing Compositions 1A-1E contained 0.45 wt. % alpha alumina particles, and Polishing Composition 1F contained 0.7 wt. % alpha alumina particles), 1 wt. % hydrogen peroxide, 0.1 wt. % ammonium hydroxide, 0.05 wt. % benzotriazole (BTA), and water, and was pH-adjusted with potassium hydroxide to a pH of 9.5. Each polishing composition also contained a simple amino acid of the type and in the amount listed in Table 1.

The substrates were polished with Polishing Compositions 1A-1F under the same polishing conditions. Following polishing, the cobalt removal rate (RR) was determined for each substrate. The results are set forth in Table 1.

TABLE 1

Cobalt Removal Rate (RR) as a Function of Type of Simple Amino Acid

| Polishing Composition | Simple Amino Acid | | RR (Å/min) |
|---|---|---|---|
| | Type | Amount (wt. %) | |
| 1A | β-alanine | 0.145 | 26 |
| 1B | L-aspartic acid | 0.212 | 144 |
| 1C | glycine | 0.122 | 60 |
| 1D | lysine | 0.237 | 47 |
| 1E | arginine | 0.283 | 47 |
| 1F | L-proline | 0.374 | 44 |

These results demonstrate that polishing compositions including a simple amino acid, i.e., β-alanine, L-aspartic acid, glycine, lysine, arginine, or L-proline, without a rate accelerator comprising a phosphonic acid, an N-heterocyclic compound, or a combination thereof, do not provide effective cobalt removal rates at alkaline pH, i.e., at a pH of 9.5. FIG. 1 provides a graphical illustration of the relationship between the type of simple amino acid included in the polishing composition and the cobalt removal rate (RR) (Å/min). In particular, the results reflected in FIG. 1 and Table 1 demonstrate that polishing compositions including β-alanine, L-aspartic acid, glycine, lysine, arginine, or L-proline, and having a pH of 9.5, provided cobalt removal rates of less than 150 Å/min. Thus, these results demonstrate the need for polishing compositions including a rate accelerator for cobalt.

Example 2

This example demonstrates that polishing compositions including a rate accelerator comprising a phosphonic acid, an N-heterocyclic compound, or a combination thereof provide effective cobalt removal rates.

Cobalt (Co) substrates were polished with five polishing compositions (i.e., Polishing Compositions 2A-2E). Each of Polishing Compositions 2A-2E contained 0.7 wt. % alpha alumina particles, wherein at least a portion of the surface of the alpha alumina particles was coated with a negatively-charged polymer or copolymer, 1 wt. % hydrogen peroxide, 0.1 wt. % ammonium hydroxide, 0.05 wt. % benzotriazole (BTA), 0.05 wt. % polyacrylic acid, 0.0031 wt. % KORDEK™ MLX (i.e., a biocide), and water. Each polishing composition also was pH-adjusted to a pH of 9.5 with potassium hydroxide (i.e., Polishing Compositions 2A-2D), or to a pH of 9 with nitric acid (i.e., Polishing Composition 2E). Each polishing composition also contained a rate accelerator of the type and in the amount listed in Table 2.

The substrates were polished with Polishing Compositions 2A-2E under the same polishing conditions. Following polishing, the cobalt removal rate (RR) was determined for each substrate. The results are set forth in Table 2.

TABLE 2

Cobalt Removal Rate (RR) as a Function of Type and Amount of Rate Accelerator

| Polishing Composition | Rate Accelerator | | RR (Å/min) |
|---|---|---|---|
| | Type | Amount (wt. %) | |
| 2A | picolinic acid | 0.4 | 1092 |
| 2B | L-histidine | 0.4 | 1014 |
| 2C | L-histidine | 0.8 | 1512 |
| 2D | DEQUEST ™ 2000 | 0.4 | 2803 |
| 2E | 2-mercapto-1-methylimidazole | 0.2 | 2451 |

Figure 2:
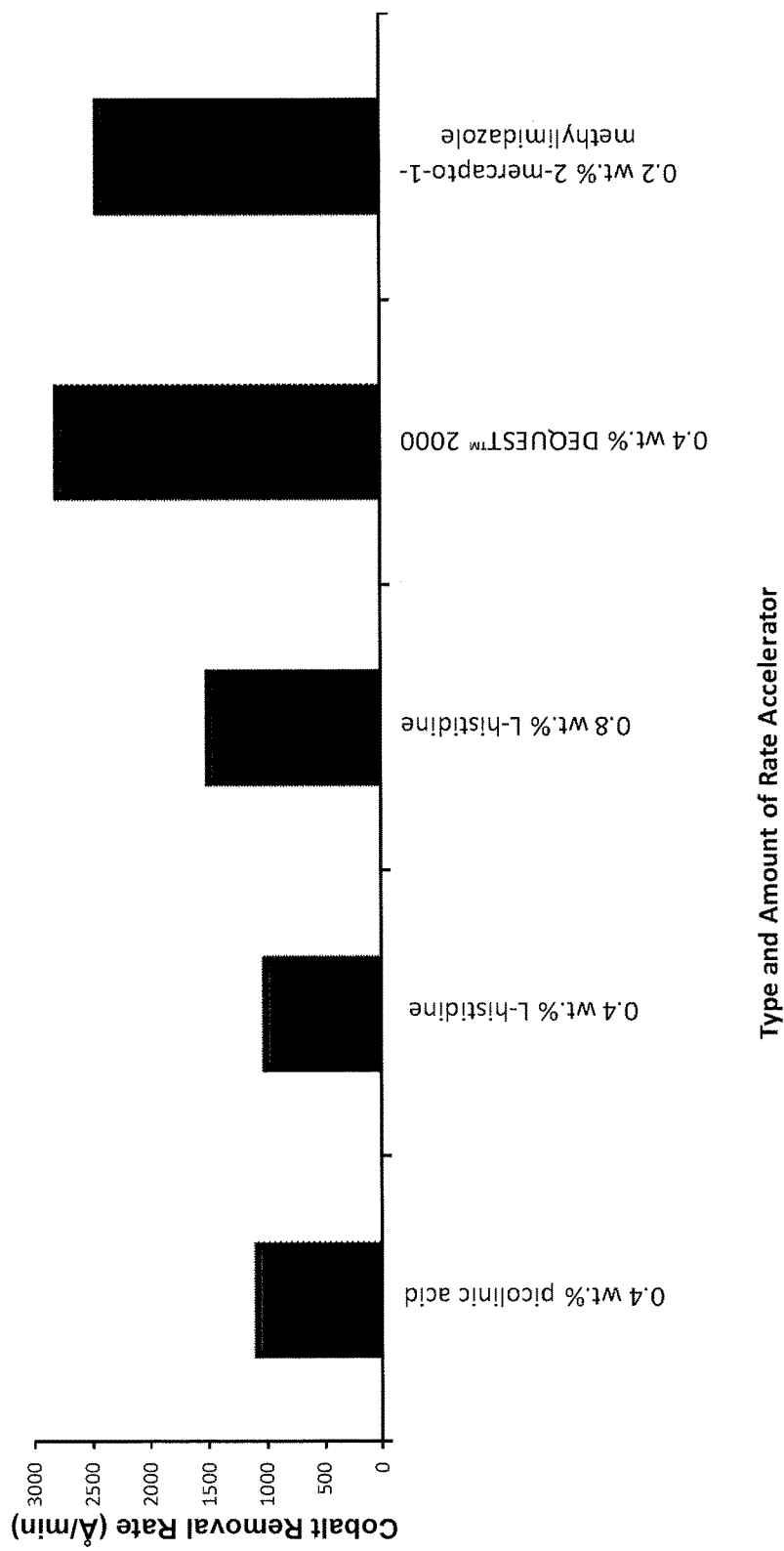
FIG. 2 illustrates the cobalt removal rate (Å/min) for polishing compositions comprising different rate accelerators, or amounts thereof, and benzotriazole (BTA).

These results demonstrate that polishing compositions including a rate accelerator comprising a phosphonic acid, N-heterocyclic compound, or combination thereof, i.e., picolinic acid, L-histidine, DEQUEST™ 2000, or 2-mercapto-1-methylimidazole, provide effective cobalt removal rates. FIG. 2 provides a graphical illustration of the relationship between the type and amount of rate accelerator included in the polishing composition and the resulting cobalt removal rate (RR) (Å/min). In particular, the results reflected in FIG. 2 and Table 2 illustrate that Polishing Compositions 2A-2E provided cobalt removal rates that were, at a minimum, seven times greater than the highest cobalt removal rate provided by a polishing composition including a simple amino acid without a rate accelerator comprising a phosphonic acid, N-heterocyclic compound, or combination thereof (compare, for example, Polishing Composition 1B with Polishing Composition 2B).

These results further demonstrate that DEQUEST™ 2000 and 2-mercapto-1-methylimidazole are particularly effective rate accelerators for cobalt, even when included in polishing compositions at low concentrations (compare Polishing Composition 2D with Polishing Compositions 2A-2C, and compare Polishing Composition 2E with Polishing Compositions 2A-2C).

Example 3

This example demonstrates that polishing compositions including a rate accelerator comprising a phosphonic acid, an N-heterocyclic compound, or a combination thereof, and a corrosion inhibitor comprising an amphoteric surfactant, a sulfonate, a phosphonate, a carboxylate, a fatty acid amino acid, an amine, an amide, or a combination thereof, provide effective cobalt removal rates and desirable cobalt static etch rates.

Cobalt (Co) substrates were polished with five polishing compositions (i.e., Polishing Compositions 3A-3E). Each of Polishing Compositions 3A-3E contained 0.7 wt. % alpha alumina particles, wherein at least a portion of the surface of the alpha alumina particles was coated with a negatively-charged polymer or copolymer, 1 wt. % hydrogen peroxide, 0.1 wt. % ammonium hydroxide, 0.05 wt. % polyacrylic acid, 0.015 wt. % PLURONIC™ F108, 0.0031 wt % KORDEK™ MLX (i.e., a biocide), and water, and was pH-adjusted with potassium hydroxide to a pH of 9.5. Each polishing composition also contained a rate accelerator and a corrosion inhibitor of the types and in the amounts listed in Table 3.

The substrates were polished with Polishing Compositions 3A-3E under the same polishing conditions. Following polishing, the cobalt removal rate (RR) and the cobalt static etch rate (SER) were determined for each substrate. The cobalt removal rate for Polishing Composition 3B was determined as an average of five runs. The results are set forth in Table 3.

TABLE 3

Cobalt Removal Rate (RR) and Static Etch Rate (SER) as a Function of Rate Accelerator and Type and Amount of Corrosion Inhibitor

| Polishing Composition | Rate Accelerator | | Corrosion Inhibitor | | RR (Å/min) | SER (Å/min) |
|---|---|---|---|---|---|---|
| | Type | Amount (wt. %) | Type | Amount (wt. %) | | |
| 3A | DEQUEST ™ 2000 | 0.8 | PERLASTAN ™ C30 | 0.05 | 3630 | 22 |
| 3B | DEQUEST ™ 2000 | 0.8 | PERLASTAN ™ C30 | 0.1 | 3865 | ~25-30 |
| 3C | DEQUEST ™ 2000 | 0.8 | SERDOLAMIDE ™ PPF 67 | 0.015 | 2583 | 76 |

TABLE 3-continued

Cobalt Removal Rate (RR) and Static Etch Rate (SER) as a Function of Rate Accelerator and Type and Amount of Corrosion Inhibitor

| Polishing Composition | Rate Accelerator | | Corrosion Inhibitor | | RR (Å/min) | SER (Å/min) |
|---|---|---|---|---|---|---|
| | Type | Amount (wt. %) | Type | Amount (wt. %) | | |
| 3D | DEQUEST ™ 2000 | 0.8 | SERDOLAMIDE ™ PPF 67 | 0.05 | 2312 | 71 |
| 3E | DEQUEST ™ 2000 | 0.8 | HOSTAPUR ™ SAS 30 | 0.1 | 2479 | 84 |

Figure 3:
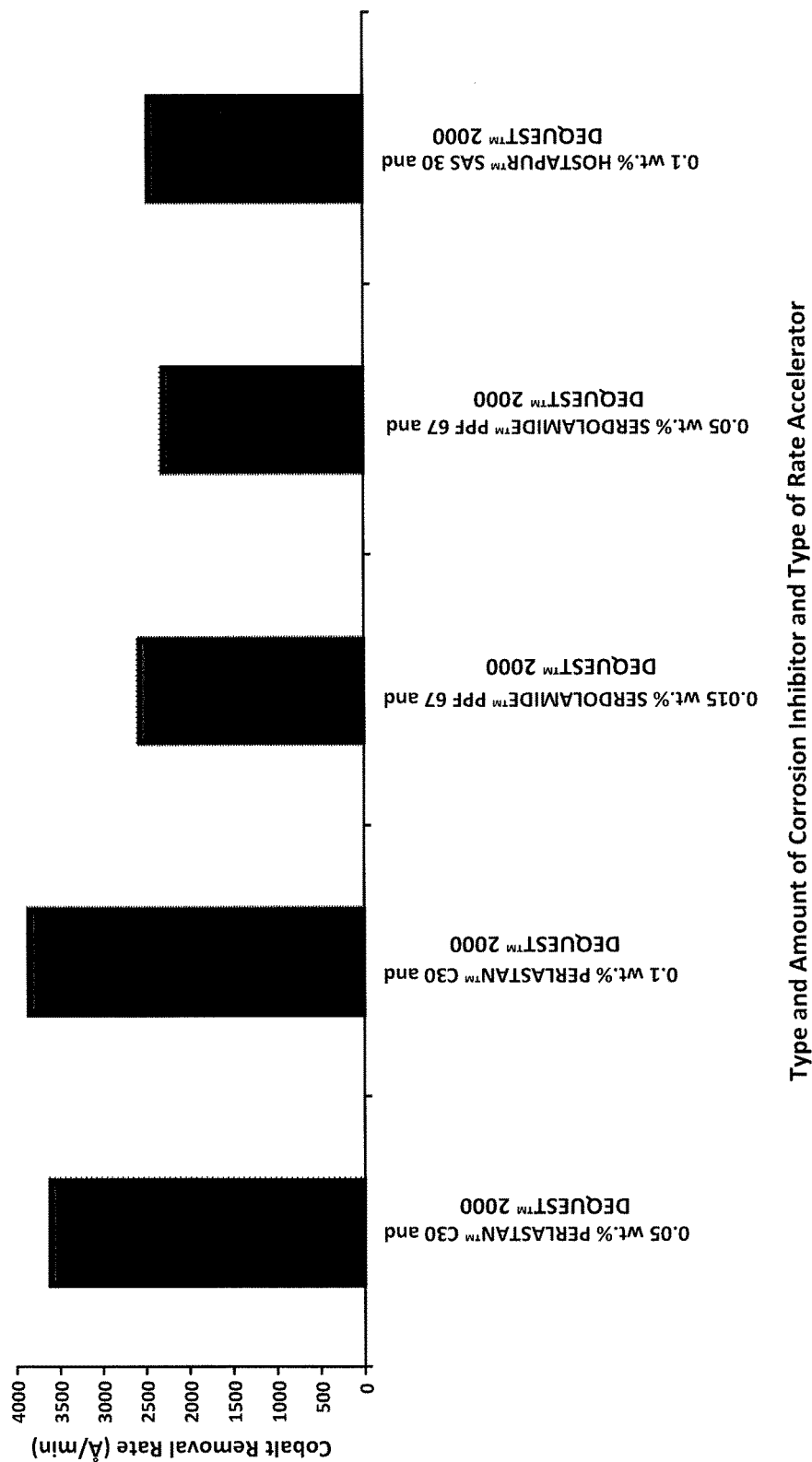
FIG. 3 illustrates the cobalt removal rate (Å/min) for polishing compositions comprising different rate accelerators, or amounts thereof, and a corrosion inhibitor.

These results demonstrate that polishing compositions including a rate accelerator, i.e., DEQUEST™ 2000, and a corrosion inhibitor, i.e., PERLASTAN™ C30, SERDOLAMIDE™ PPF 67, or HOSTAPUR™ SAS 30, effectively suppress cobalt etching while maintaining the accelerated cobalt removal rate provided by the rate accelerator(s). FIG. 3 provides a graphical illustration of the impact of the particular combination of rate accelerator and corrosion inhibitor on the cobalt removal rate (RR) (Å/min). These results further demonstrate that the combination of PERLASTAN™ C30 and DEQUEST™ 2000 was particularly effective, because it provided the lowest static etch rate for cobalt, while maintaining the highest cobalt removal rate (compare Polishing Compositions 3A and 3B with Polishing Compositions 3C-3E).

Example 4

This example demonstrates that polishing compositions including a rate accelerator comprising a phosphonic acid, an N-heterocyclic compound, or a combination thereof provide effective cobalt removal rates.

Cobalt (Co) substrates were polished with five polishing compositions (i.e., Polishing Compositions 4A-4E). Each of Polishing Compositions 4A-4E contained 0.5 wt. % anionic colloidal silica (Polishing Composition 4A) or 1.5 wt. % anionic colloidal silica (Polishing Compositions 4B-4E), 1 wt. % hydrogen peroxide, and water. Polishing Compositions 4A and 4C-4E were pH-adjusted with potassium hydroxide to a pH of 7, and Polishing Composition 4B was pH-adjusted with nitric acid to a pH of 7. Each polishing composition also contained a rate accelerator of the type and in the amount listed in Table 4.

The substrates were polished with Polishing Compositions 4A-4E under the same polishing conditions. Following polishing, the cobalt removal rate (RR) was determined for each substrate. The results are set forth in Table 4.

TABLE 4

Cobalt Removal Rate (RR) as a Function of Type and Amount of Rate Accelerator

| Polishing Composition | Rate Accelerator | | RR (Å/min) |
|---|---|---|---|
| | Type | Amount (wt. %) | |
| 4A | imidazole | 1 | 7103 |
| 4B | L-histidine | 0.74 | 6365 |
| 4C | DEQUEST ™ 2010 | 0.8 | 3143 |
| 4D | citric acid | 1 | 934 |
| 4E | β-alanine | 0.42 | 346 |

Figure 4:
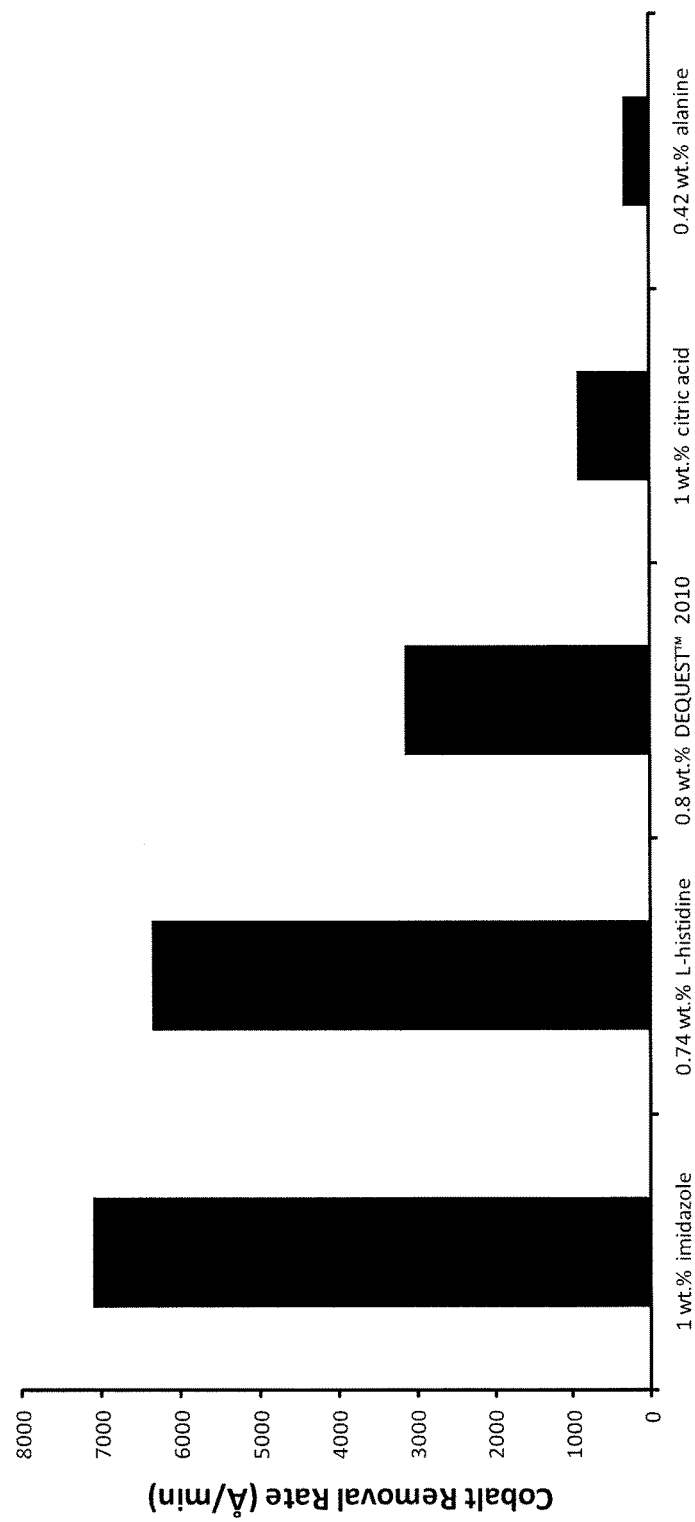
FIG. 4 illustrates the cobalt removal rate (Å/min) for polishing compositions comprising different rate accelerators, as well as for polishing compositions comprising citric acid or a simple amino acid.

These results demonstrate that polishing compositions including a rate accelerator comprising a phosphonic acid, an N-heterocyclic compound, or a combination thereof, i.e., imidazole, L-histidine, or DEQUEST™ 2010, provide effective cobalt removal rates, which are significantly higher than the cobalt removal rate provided by polishing compositions comprising citric acid or a simple amino acid, i.e., β-alanine (compare Polishing Compositions 4A-4C with Polishing Compositions 4D and 4E). FIG. 4 provides a graphical illustration of the impact of the type and amount of rate accelerator on the cobalt removal rate (Å/min). These results further demonstrate that polishing compositions comprising a relatively small amount of L-histidine or DEQUEST™ 2010 provide higher cobalt removal rates than the cobalt removal rate provided by a polishing composition comprising citric acid (compare Polishing Compositions 4B-4C with Polishing Composition 4D). In addition, these results demonstrate that a polishing composition comprising imidazole provides a cobalt removal rate that is more than seven times greater than the cobalt removal rate provided by a polishing composition comprising the same amount of citric acid (compare Polishing Composition 4A with Polishing Composition 4D).

Example 5

This example demonstrates the effectiveness of polishing compositions including a rate accelerator comprising a phosphonic acid, an N-heterocyclic compound, or a combination thereof, and a secondary rate accelerator comprising a phosphate salt, a borate salt, or a combination thereof, on the cobalt removal rate.

Cobalt (Co) substrates were polished with eight polishing compositions (i.e., Polishing Compositions 5A-5H). Each of Polishing Compositions 5A-5H contained 1.5 wt. % anionic colloidal silica, 1 wt. % hydrogen peroxide, and water. Polishing Composition 5A was pH-adjusted with nitric acid to a pH of 7, and Polishing Compositions 5B-5H were pH-adjusted with potassium hydroxide to a pH of 7. Each polishing composition also contained a rate accelerator of the type and in the amount listed in Table 5, and some polishing compositions also contained a secondary rate accelerator, as also listed in Table 5.

The substrates were polished with Polishing Compositions 5A-5H under the same polishing conditions. Following polishing, the cobalt removal rate (RR) was determined for each substrate. The results are set forth in Table 5.

TABLE 5

Cobalt Removal Rate (RR) as a Function of Type and Amount of Rate Accelerator(s)

| Polishing Composition | Rate Accelerator Type | Amount (wt. %) | Secondary Rate Accelerator Type | Amount (wt. %) | RR (Å/min) |
|---|---|---|---|---|---|
| 5A | — | — | potassium tetraborate | 0.5 | 2472 |
| 5B | — | — | ammonium phosphate | 0.5 | 1196 |
| 5C | picolinic acid | 1 | potassium tetraborate | 0.5 | 6467 |
| 5D | picolinic acid | 1 | ammonium phosphate | 0.5 | 3870 |
| 5E | picolinic acid | 1 | — | — | 1791 |
| 5F | DEQUEST™ 2000 | 0.8 | potassium tetraborate | 0.5 | 5965 |
| 5G | DEQUEST™ 2000 | 0.8 | ammonium phosphate | 0.5 | 4047 |
| 5H | DEQUEST™ 2000 | 0.8 | — | — | 2142 |

Figure 5:
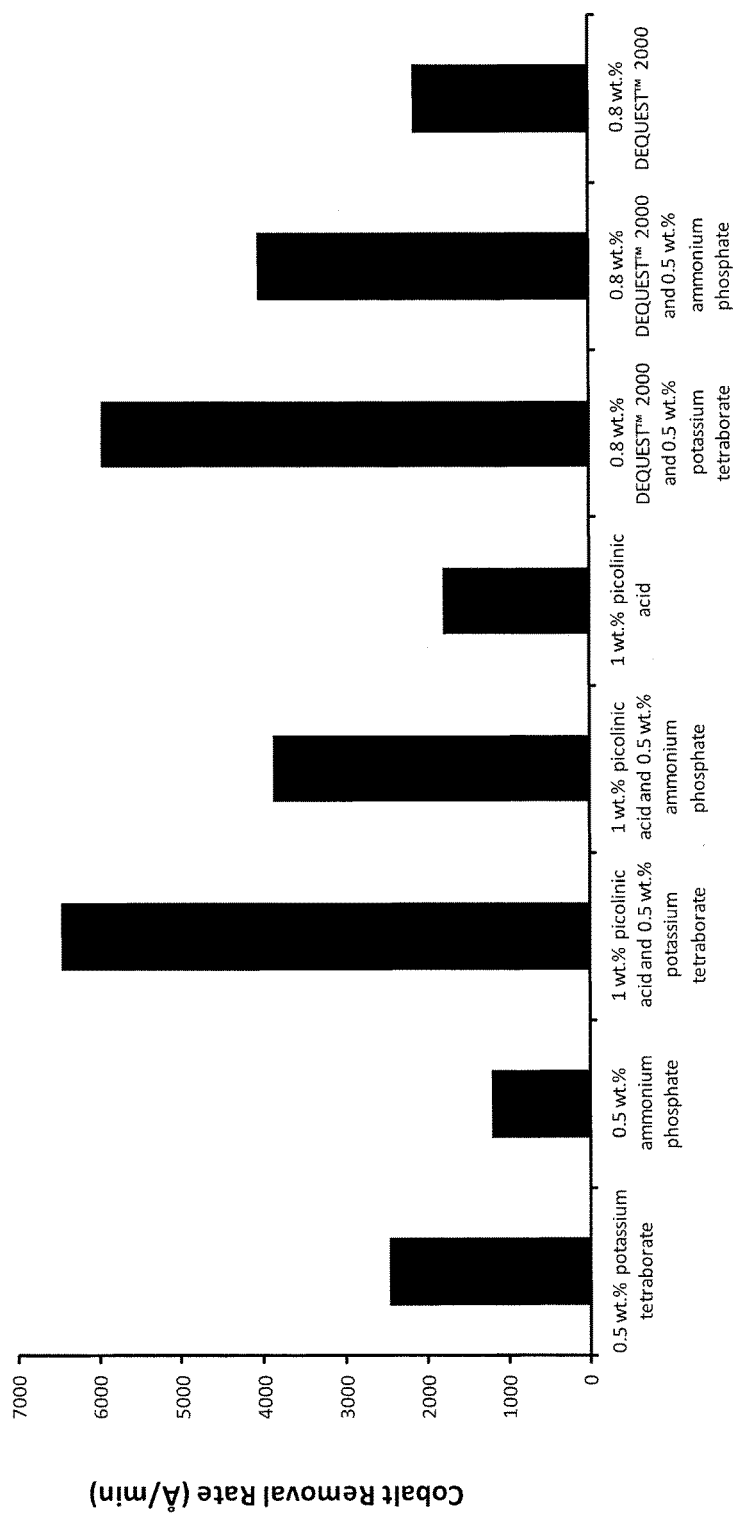
FIG. 5 illustrates the cobalt removal rate (Å/min) for polishing compositions comprising different rate accelerators, secondary rate accelerators, or combinations thereof.

These results demonstrate that polishing compositions including a rate accelerator comprising a phosphonic acid, an N-heterocyclic compound, or a combination thereof, i.e., picolinic acid or DEQUEST™ 2000, in combination with a secondary rate accelerator, i.e., potassium tetraborate or ammonium phosphate, provide accelerated cobalt removal rates. FIG. 5 provides a graphical illustration of the impact of the secondary rate accelerator on the cobalt removal rate (Å/min). In particular, the results reflected in Table 5 and FIG. 5 demonstrate that picolinic acid, when used in combination with a secondary rate accelerator, i.e., potassium tetraborate or ammonium phosphate, provides an accelerated cobalt removal rate as compared to a polishing composition including only picolinic acid (compare Polishing Compositions 5C and 5D with Polishing Composition 5E). The removal rates of polishing compositions including picolinic acid with a secondary rate accelerator were at least two times greater than, and as much as three times greater than, the removal rate of a polishing composition including picolinic acid without a secondary rate accelerator (compare Polishing Compositions 5C and 5D with Polishing Composition 5E).

These results further demonstrate that DEQUEST™ 2000, when used in combination with a secondary rate accelerator, i.e., potassium tetraborate or ammonium phosphate, provides an accelerated cobalt removal rate as compared to a polishing composition including only DEQUEST™ 2000 (compare Polishing Compositions 5F and 5G with Polishing Composition 5H). The removal rates of polishing compositions including DEQUEST™ 2000 with a secondary rate accelerator were, at a minimum, nearly two times greater than the removal rate of a polishing composition including only DEQUEST™ 2000 (compare Polishing Compositions 5F and 5G with Polishing Composition 5H).

Example 6

This example demonstrates that polishing compositions including a rate accelerator comprising a phosphonic acid, an N-heterocyclic compound, or a combination thereof, provide effective cobalt removal rates at various pH values.

Cobalt (Co) substrates were polished with seven polishing compositions (i.e., Polishing Compositions 6A-6G). Polishing Compositions 6A-6C contained 1 wt. % picolinic acid; 0.5 wt. % anionic colloidal silica (Polishing Compositions 6A-6B) or 1.5 wt. % anionic colloidal silica (Polishing Composition 6C); 1 wt. % hydrogen peroxide (Polishing Compositions 6A and 6C) or 0.5 wt. % hydrogen peroxide (Polishing Composition 6B); and water. Each of Polishing Compositions 6A-6C was pH-adjusted with nitric acid or potassium hydroxide to the pH listed in Table 6. Polishing Compositions 6D-6G contained 1 wt. % imidazole (Polishing Compositions 6D and 6F-6G) or 0.55 wt. % imidazole (Polishing Composition 6E); 0.5 wt. % anionic colloidal silica; 1 wt. % hydrogen peroxide; and water. Each of Polishing Compositions 6D-6G were pH-adjusted with nitric acid to the pH listed in Table 6.

The substrates were polished with Polishing Compositions 6A-6G under the same polishing conditions. Following polishing, the cobalt removal rate (RR) was determined for each substrate. The results are set forth in Table 6.

TABLE 6

Cobalt Removal Rate (RR) as a Function of pH

| Polishing Composition | Rate Accelerator Type | Amount (wt. %) | pH | RR (Å/min) |
|---|---|---|---|---|
| 6A | picolinic acid | 1 | 4.5 | 7412 |
| 6B | picolinic acid | 1 | 5 | 6692 |
| 6C | picolinic acid | 1 | 7 | 2592 |
| 6D | imidazole | 1 | 5 | 8414 |
| 6E | imidazole | 0.55 | 6 | 7523 |
| 6F | imidazole | 1 | 7 | 7103 |
| 6G | imidazole | 1 | 8 | 2240 |

Figure 6:
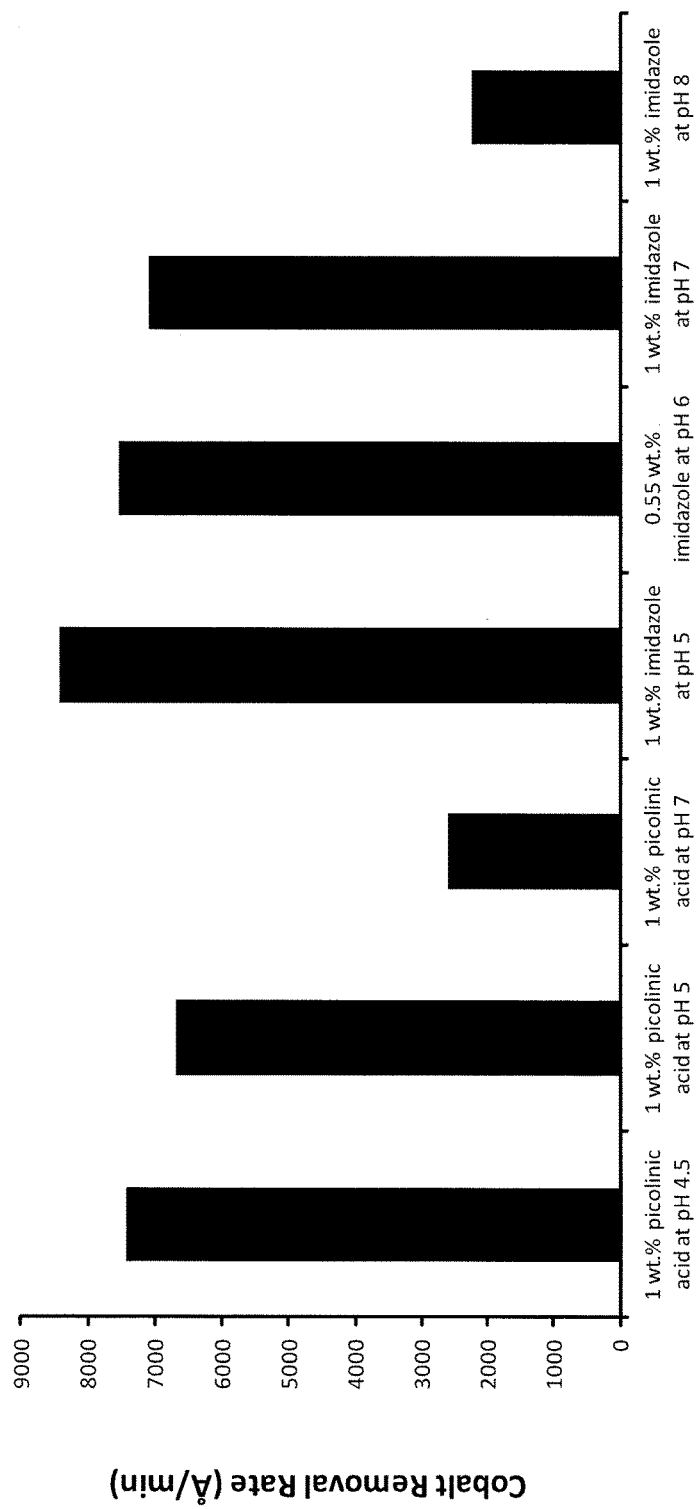
FIG. 6 illustrates the cobalt removal rate (Å/min) for polishing compositions comprising different rate accelerators with different pH values.

These results demonstrate that polishing compositions including a rate accelerator comprising a phosphonic acid, an N-heterocyclic compound, or a combination thereof, i.e., picolinic acid or imidazole, provide effective cobalt removal rates across various pH values, i.e., when the pH of the polishing composition is about 4.5 to about 8. FIG. 6 provides a graphical illustration of the impact of pH on the cobalt removal rate (Å/min).

These results further demonstrate that a polishing composition including picolinic acid provides accelerated cobalt removal rates when the pH of the polishing composition is about 4.5 to about 5 (compare Polishing Compositions 6A and 6B with Polishing Composition 6C). In addition, these results demonstrate that a polishing composition including imidazole provides accelerated cobalt removal rates when the pH of the polishing composition is about 5 to about 7 (compare Polishing Compositions 6D-6F with Polishing Composition 6G). Without wishing to be bound by theory, it is believed that rate accelerators comprising an N-heterocyclic compound, i.e., picolinic acid or imidazole, provide accelerated cobalt removal rates at pH values which are similar to, or within about 0-2 units lower than, the pKa value of the conjugated acid of the amine. The pKa of picolinic acid, for example, is 5.3, and the pKa of imidazole is 7.

Example 7

This example demonstrates that polishing compositions including a corrosion inhibitor comprising an amphoteric surfactant, a sulfonate, a phosphonate, a carboxylate, a fatty acid amino acid, an amine, an amide, or a combination thereof, effectively suppress cobalt etching while maintaining accelerated cobalt removal rates.

Cobalt (Co) substrates were polished with six polishing compositions (i.e., Polishing Compositions 7A-7F). Polishing Compositions 7A-7B contained 0.5 wt. % picolinic acid and 0.25 wt. % potassium tetraborate, 0.5 wt. % anionic colloidal silica, 1 wt. % hydrogen peroxide, and water, and were adjusted to a pH of 7 with potassium hydroxide. Polishing Compositions 7C-7D contained 1 wt. % picolinic acid, 0.5 wt. % potassium tetraborate, 1.5 wt. % anionic colloidal silica, 1 wt. % hydrogen peroxide, and water, and were adjusted to a pH of 7 with potassium hydroxide. Polishing Compositions 7E-7F contained 1 wt. % picolinic acid, 0.2 wt. % ammonium phosphate, 0.5 wt. % anionic colloidal silica, 0.5 wt. % hydrogen peroxide, and water, and were adjusted to a pH of 5 with potassium hydroxide. Some of the polishing compositions also contained corrosion inhibitors of the types and in the amounts listed in Table 7.

The substrates were polished with Polishing Compositions 7A-7F under the same polishing conditions. Following polishing, the cobalt removal rate (RR) and the cobalt static etch rate (SER) were determined for each substrate. The results are set forth in Table 7.

TABLE 7

Cobalt Removal Rate (RR) and Static Etch Rate (SER) as a Function of Type and Amount of Corrosion Inhibitor

| Polishing Composition | Corrosion Inhibitor | | RR (Å/min) | SER (Å/min) |
| --- | --- | --- | --- | --- |
| | Type | Amount (wt. %) | | |
| 7A | PERLASTAN ™ C | 0.005 | 2419 | 4 |
| 7B | — | — | 2540 | 77 |
| 7C | MIRATAINE ™ H2C-HA | 0.03 | 3345 | 44 |
| 7D | — | — | 3388 | 113 |
| 7E | PERLASTAN ™ C | 0.05 | 6996 | 23 |
| 7F | — | — | 7231 | 500 |

Figure 7:
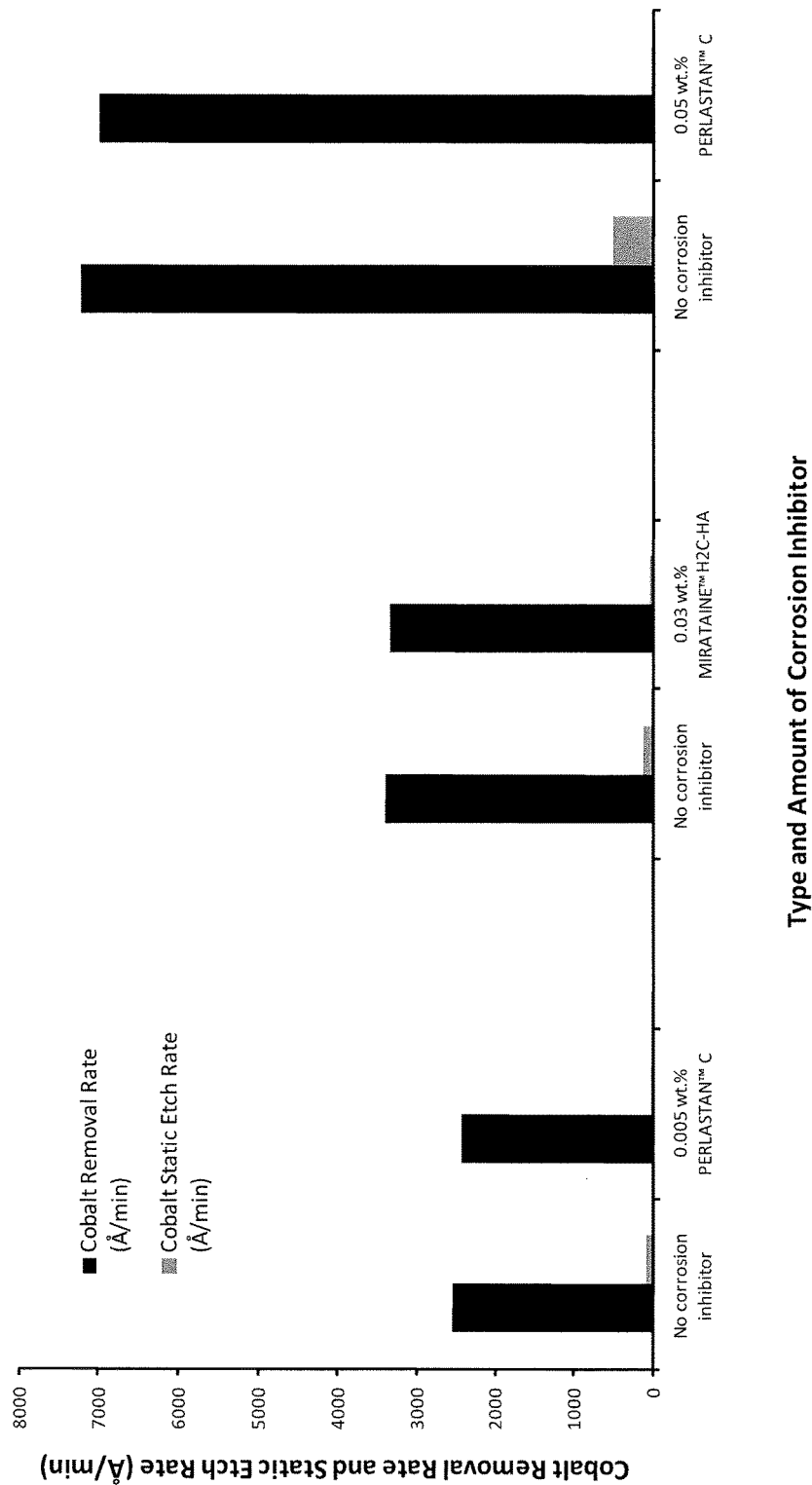
FIG. 7 illustrates the cobalt removal rate (Å/min) (left, shown in black on the primary y-axis) and the cobalt static etch rate (Å/min) (right, shown in gray on the secondary y-axis) for polishing compositions comprising different rate accelerators, secondary rate accelerators, and corrosion inhibitors, as well as for the same polishing compositions without the corrosion inhibitors.

These results demonstrate that polishing compositions including a corrosion inhibitor comprising an amphoteric surfactant, a sulfonate, a phosphonate, a carboxylate, a fatty acid amino acid, an amine, an amide, or a combination thereof, i.e., PERLASTAN™ C or MIRATAINE™ H2C-HA, effectively suppress cobalt etching while maintaining the accelerated cobalt removal rate provided by the rate accelerator(s). FIG. 7 provides a graphical illustration of effect of corrosion inhibitors on the static etch rate (Å/min) (right, shown in gray on the secondary γ-axis) and removal rate of cobalt (Å/min) (left, shown in black on the primary γ-axis). The results reflected in FIG. 7 and Table 7 demonstrate that PERLASTAN™ C and MIRATAINE™ H2C-HA do not significantly reduce the accelerated cobalt removal rates provided by a rate accelerator comprising a phosphonic acid, an N-heterocyclic compound, or a combination thereof, and a secondary rate accelerator comprising a phosphate salt, a borate salt, or a combination thereof (compare Polishing Compositions 7A with 7B, 7C with 7D, and 7E with 7F). These results further demonstrate that a low concentration of corrosion inhibitor is effective to reduce the static etch rate of cobalt (compare Polishing Composition 7A with Polishing Composition 7B). In addition, these results demonstrate that a higher concentration of corrosion inhibitor does not compromise the accelerated cobalt removal rate provided by the rate accelerator(s) (compare Polishing Composition 7E with Polishing Composition 7F).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) about 0.1 wt. % to about 13 wt. % of an abrasive comprising alumina particles, silica particles, or a combination thereof,
   (b) about 0.05 wt. % to about 5 wt. % of a rate accelerator comprising a phosphonic acid, an N-heterocyclic compound, or a combination thereof,
   (c) a corrosion inhibitor comprising an amphoteric surfactant, a sulfonate, a fatty acid amino acid, an amide, or a combination thereof,
   (d) about 0.1 wt. % to about 5 wt. % of an oxidizing agent, and
   (e) an aqueous carrier, wherein the polishing composition further comprises a secondary rate accelerator comprising a phosphate salt, a borate salt, or a combination thereof, at a concentration of about 0.1 wt. % to about 1 wt. %.

2. The chemical-mechanical polishing composition of claim 1, wherein the abrasive comprises alumina particles, wherein the alumina particles are alpha alumina particles, and wherein at least a portion of the surface of the alpha alumina particles is coated with a negatively-charged polymer or copolymer.

3. The chemical-mechanical polishing composition of claim 1, wherein the abrasive comprises silica particles, and wherein the silica particles are colloidal silica particles.

4. The chemical-mechanical polishing composition of claim 1, wherein the abrasive is present in the polishing composition at a concentration of about 0.3 wt. % to about 4 wt. %.

5. The chemical-mechanical polishing composition of claim 1, wherein the rate accelerator is present in the polishing composition at a concentration of about 0.2 wt. % to about 1 wt. %.

6. The chemical-mechanical polishing composition of claim 1, wherein the rate accelerator comprises a phosphonic acid.

7. The chemical-mechanical polishing composition of claim 6, wherein the phosphonic acid is an amino tri (methylene phosphonic acid).

8. The chemical-mechanical polishing composition of claim 1, wherein the rate accelerator comprises an N-heterocyclic compound.

9. The chemical-mechanical polishing composition of claim 8, wherein the N-heterocyclic compound is picolinic acid, L-histidine, 2-mercapto-1-methylimidazole, or imidazole.

10. The chemical-mechanical polishing composition of claim 1, wherein the corrosion inhibitor is present in the polishing composition at a concentration of about 0.001 wt. % to about 0.25 wt. %.

11. The chemical-mechanical polishing composition of claim 1, wherein the corrosion inhibitor is a fatty acid amino acid.

12. The chemical-mechanical polishing composition of claim 11, wherein the fatty acid amino acid is sodium lauroyl sarcosinate, sodium cocoyl alaninate, cocoyl glutamate, cocoyl sarcosinate, or myristoyl sarcosinate.

13. The chemical-mechanical polishing composition of claim 1, wherein the corrosion inhibitor is a sodium $C_{14-17}$ sec-alkyl sulfonate.

14. The chemical-mechanical polishing composition of claim 1, wherein the corrosion inhibitor is a cocoyl diethanolamide.

15. The chemical-mechanical polishing composition of claim 1, wherein the polishing composition further comprises an ethylene oxide/propylene oxide block copolymer.

16. The chemical-mechanical polishing composition of claim 15, wherein the ethylene oxide/propylene oxide block copolymer is present in the polishing composition at a concentration of about 0.005 wt. % to about 0.1 wt. %.

17. The chemical-mechanical polishing composition of claim 1, wherein the polishing composition further comprises polyacrylic acid.

18. The chemical-mechanical polishing composition of claim 1, wherein the pH of the polishing composition is about 4 to about 7.

19. The chemical-mechanical polishing composition of claim 1, wherein the pH of the polishing composition is about 8 to about 11.

* * * * *